United States Patent [19]

Estop et al.

[11] Patent Number: 5,545,932
[45] Date of Patent: Aug. 13, 1996

[54] SUPERCONDUCTING SWITCH AND APPLICATION TO A CHARGER FOR A SUPERCONDUCTING COIL

[75] Inventors: Pascal Estop, Vitry sur Seine; Serge Poullain, Ste Genevieve des Bois; Thierry Verhaege, Saulx les Chartreux, all of France

[73] Assignee: GEC Alsthom Electromecanique Sa, Paris, France

[21] Appl. No.: 227,335

[22] Filed: Apr. 14, 1994

[30] Foreign Application Priority Data

May 5, 1993 [FR] France .................................. 93 05367

[51] Int. Cl.$^6$ ...................................................... H01B 12/02
[52] U.S. Cl. .......................... 307/104; 327/527; 505/231; 174/125.1
[58] Field of Search ............................ 307/104, 106–108; 326/1; 327/366, 368, 369, 371, 372, 373, 527; 361/19, 141; 336/DIG. 1; 338/325; 323/360; 335/216; 505/230, 231, 851, 856, 860, 880; 174/125.1

[56] References Cited

U.S. PATENT DOCUMENTS

| | | | |
|---|---|---|---|
| 3,444,307 | 5/1969 | Kafka et al. | 335/216 |
| 3,848,162 | 11/1974 | Ichikawa et al. | 361/141 |
| 4,709,314 | 11/1987 | van de Klundert et al. | 327/527 |
| 4,906,861 | 3/1990 | Roy et al. | 361/141 |
| 5,227,669 | 7/1993 | Riebman | 327/527 |
| 5,387,890 | 2/1995 | Estop et al. | 338/32 S |

FOREIGN PATENT DOCUMENTS 2674671  10/1992  France.

OTHER PUBLICATIONS

G. B. J. Mulder et al, "Development of a Thermally Switched Superconducting Rectifier for 100 kA", *IEEE Transactions on Magnetics*, vol. 27, No. 2, Mar. 1991, pp. 2333–2336.
Japanese Patent Abstract JP1136317 dated May 29, 1989.
Japanese Patent Abstract JP62214680 dated Sep. 21, 1987.
French Search Report FR 9305367.

*Primary Examiner*—William M. Shoop, Jr.
*Assistant Examiner*—Richard T. Elms
*Attorney, Agent, or Firm*—Sughrue, Mion, Zinn, Macpeak & Seas

[57] ABSTRACT

A superconducting switch comprising a portion of cable including a resistive central strand that is non-superconducting having a plurality of super-conducting strands or of superconductors twisted thereabout, and separated from the central strand by electrical insulation, the cable as a whole being insulated from the external cooling medium by thermal insulation. The central strand is electrically connected to the superconducting strands or the superconductors at each end of a portion of cable. A portion of the length of the resistive central strand extends outside the cable at a point along the length of the portion of said cable and is coupled to a control device situated outside the cooling medium, wherein the control device injector an electrical current into the circuit formed by the resistive central strand that is connected at its ends to the superconducting strands or to the superconductors.

5 Claims, 4 Drawing Sheets

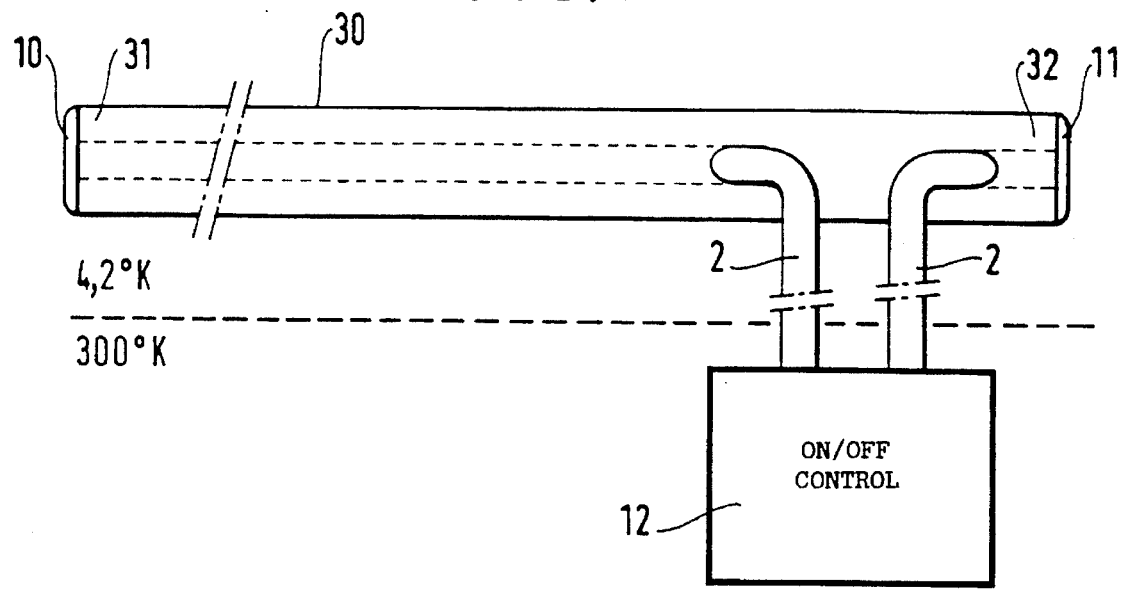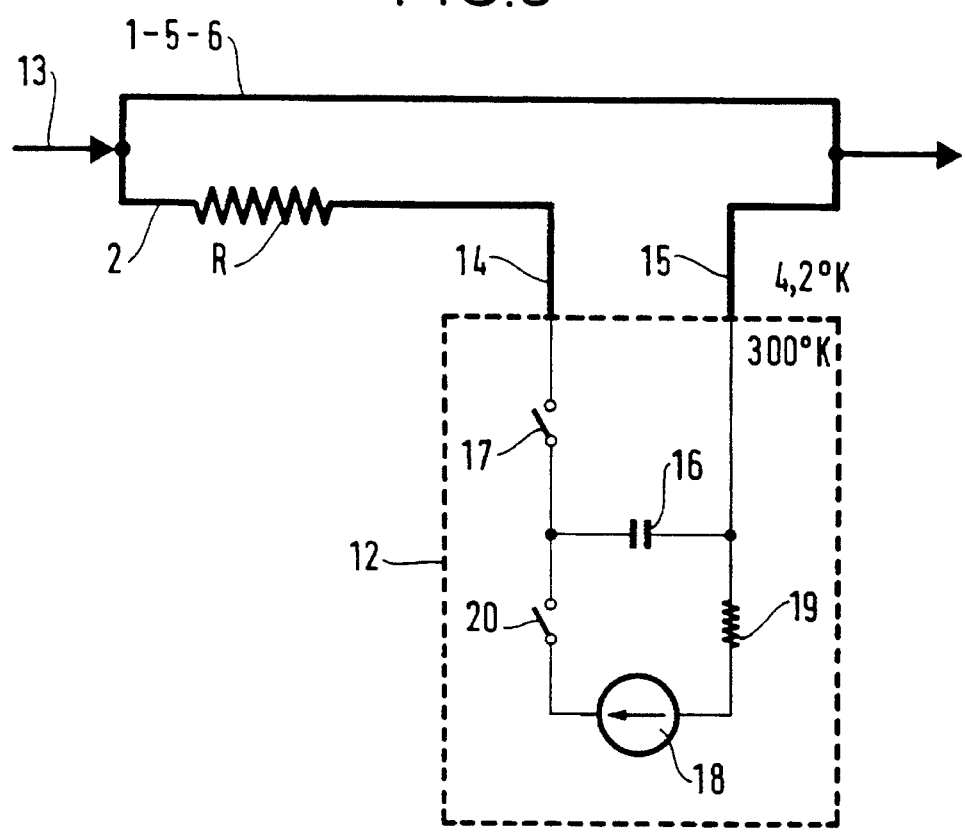

SUPERCONDUCTING SWITCH AND APPLICATION TO A CHARGER FOR A SUPERCONDUCTING COIL

The present invention relates to a superconducting switch.

BACKGROUND OF THE INVENTION

A fuel-wave rectifier device is known from the journal "IEEE Transactions on Magnetics", Vol. 27, No. 2, March 1991, pages 2333–2336, which includes a primary winding and two secondary windings disposed in parallel and wound in mutually opposite directions and connected to a superconducting coil for charging it. Each of the secondary windings is constituted by 1610 superconducting wires connected in parallel and organized in 230 strips of seven wires each.

The strips are connected together in groups of ten, thus making up 23 parallel-connected groups each of 7×10 wires in parallel, together constituting a single superconductor.

For one of the secondary windings, this superconductor is helically wound on the outside surface of a cylinder over 11/23-rds of a turn, and for the other is wound in the opposite direction over 12/23-rds of a turn on the inside surface of the cylinder inside which the primary winding is to be found.

Each of the secondary windings is fitted with two heater elements each occupying a small width, 5 mm, of the superconductor that forms the winding: one heater element on each face of the superconductor. A heater element is constituted by a plurality of turns of manganin wire.

Those heater elements serve to change the conductivity state of the two superconductors constituting the secondary windings feeding the superconducting coil to be charged.

That provides one example of a superconducting switch. However such a disposition suffers from certain drawbacks:

the need to place the heater elements around the superconductor makes switches complicated to implement;

since the heater elements and the superconductor are not at the same electrical potential, it is necessary to provide good electrical insulation between them; and the need to have good thermal insulation between the superconducting switch and the helium increases recovery time, and therefore, in the example of the above article which relates to a rectifier for charging a superconducting coil, the maximum operating frequency of the rectifier is reduced. Thus, in that article, the maximum frequency is not more than 0.5 Hz.

OBJECT AND BRIEF SUMMARY OF THE INVENTION

An object of the invention is to mitigate those drawbacks, and the invention provides a superconducting switch comprising a portion of cable including a resistive central strand that is non-superconducting having a plurality of superconducting strands or of superconductors twisted thereabout, and separated from the central strand by electrical insulation, the cable as a whole being insulated from the external cooling medium by thermal insulation, said central strand being electrically connected to said superconducting strands or said superconductors at each end of said portion of cable, wherein a portion of the length of said resistive central strand extends outside said cable at a point along the length of said portion of said cable and is coupled to a control device situated outside said cooling medium, said control device consisting in means for injecting an electrical current into the circuit formed by the resistive central strand that is connected at its ends to the superconducting strands or to the superconductors.

In a particular embodiment, said portion of the length of said resistive central strand outside said cable is cut, thereby forming two ends which are connected to said control device that comprises a capacitor in series with a discharge switch, a voltage source being connected across the terminals of said capacitor via a charging resistor and a charging switch.

The invention also provides a charger for a superconducting coil, the charger comprising an AC voltage source in a medium at ambient temperature, and connected to a full-wave rectifier circuit feeding the superconducting coil, the rectifier and the coil being situated in a refrigerating medium, the rectifier circuit comprising a transformer having a primary winding and a secondary winding in two portions, each portion being connected in parallel with the coil and feeding it alternately via control means that operate every other half-cycle to cause the connection between the corresponding portion of said secondary winding and the coil to switch from the superconducting state to the normal state, wherein each of said control means comprises a superconducting switch as defined above.

BRIEF DESCRIPTION OF THE DRAWINGS

FIG. 4 shows a superconducting switch of the invention.

FIG. 5 is an electrical circuit diagram symbolizing a superconducting switch of the invention inserted in a superconducting line and it shows a particular control device.

MORE DETAILED DESCRIPTION

Figure 1:
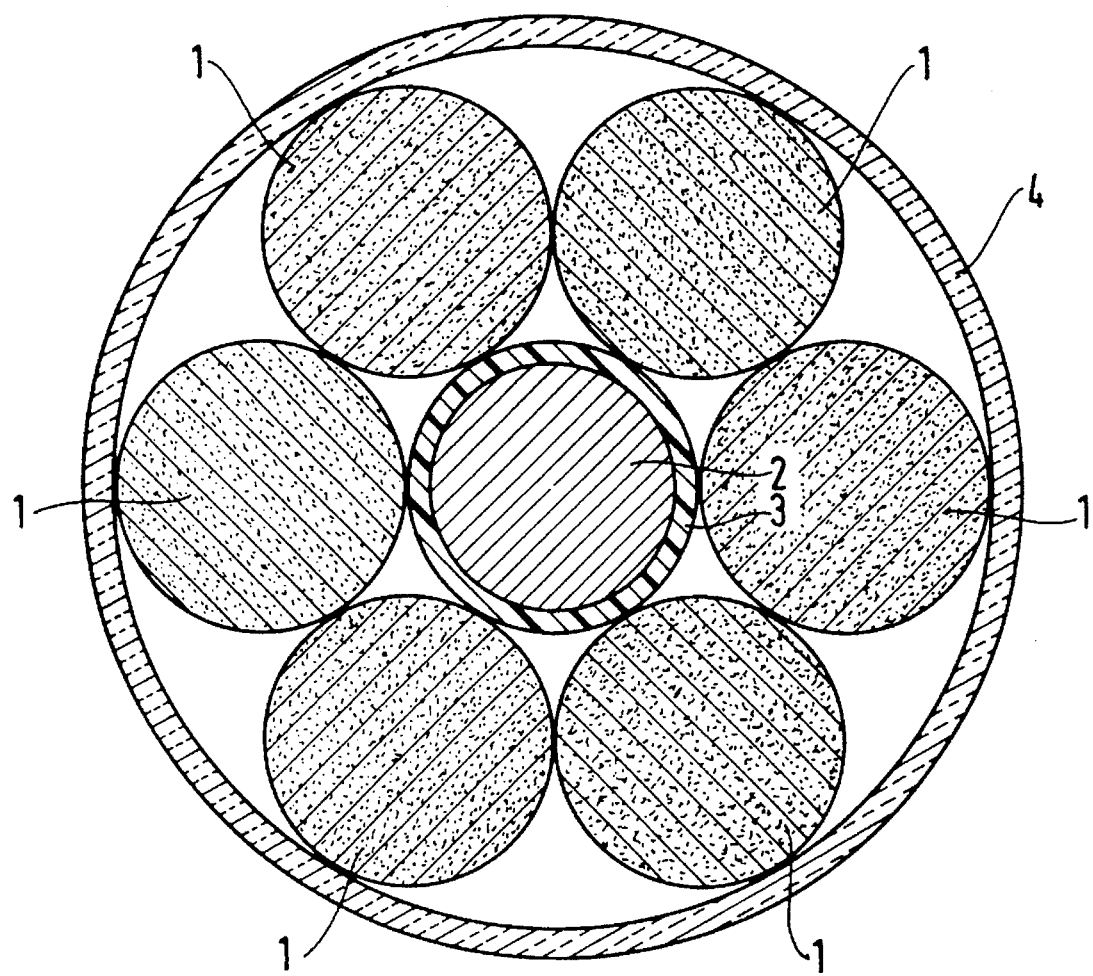
FIGS. 1, 2, and 3 are sections through three examples of cables suitable for use in implementing a superconducting switch of the invention.
Figure 6:
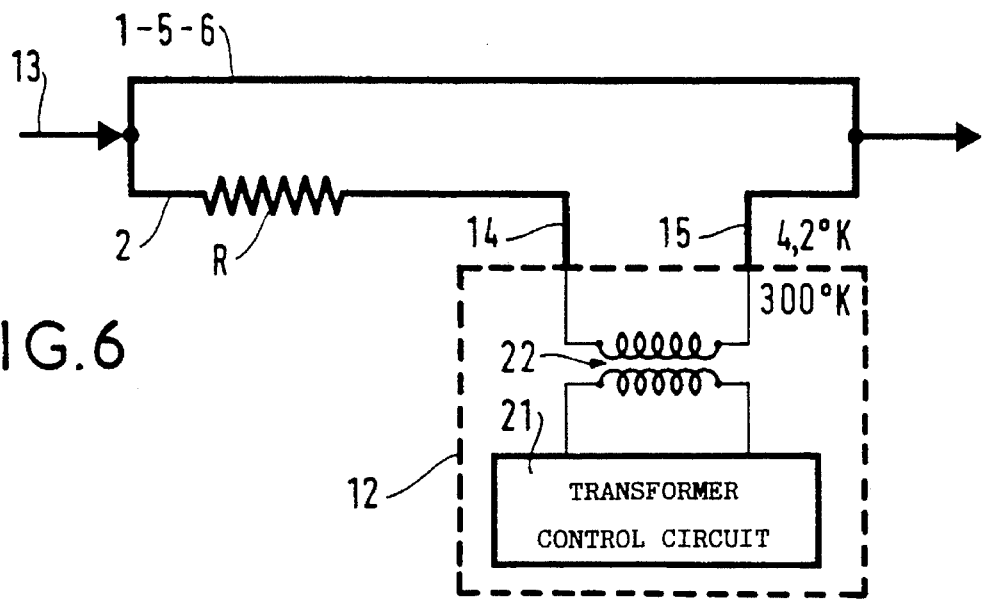
FIG. 6 is an electrical circuit diagram similar to FIG. 5, showing a different disposition for the control device.

With reference to FIG. 1, there can be seen the section of a cable suitable for use in implementing a superconducting switch of the invention as shown in FIGS. 4, 5, and 6.

The cable shown is made up of six superconducting strands 1 each made up of niobium titanate (NbTi) filaments embedded in a cupro-nickel (CuNi) matrix, and twisted around a resistive central strand that is not superconducting.

The central strand may be either of CuNi or of CuNi containing copper (Cu) filaments, and it is separated from the six superconducting strands 1 by an electrical insulator 3. The insulator is preferably a good conductor of heat in order to allow the heat given off by the central strand 2 due to the Joule effect to diffuse quickly into the superconducting strands 1. A material that satisfies these two conditions well, namely the conditions of being both an electrical insulator and a good conductor of heat, is aluminum nitride or any similar material.

Thus, the insulation 3 may be constituted, for example, by a resin filled with aluminum nitride. The cable as a whole is insulated by a thermal insulator 4. The length of such a cable that is used as a superconducting switch is situated, in operation, in a refrigerating medium such as liquid helium at 4.2 K. The thermal insulation 4 must both be sufficient to limit the power required for heating the superconducting strands 1 by means of the power dissipated in the central strand 2, and also be small enough to enable the superconducting state to be recovered (by cooling of the superconducting strands) in a period of time compatible with operation at high frequencies such as 50 Hz.

For operation at lower frequencies, the insulation 4 may be greater.

Figure 2:
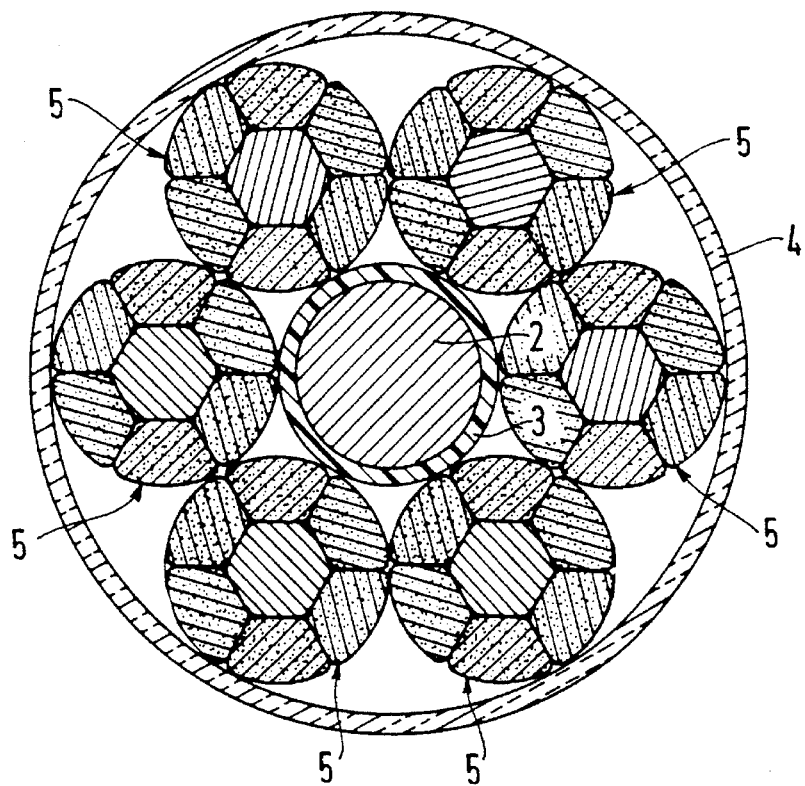

FIG. 2 shows another example of a cable that can be used for making a superconducting switch.

In this case the cable is made up of six superconductors 5 twisted around a central resistive strand 2 that is not a superconductor and separated therefrom by electrical insulation 3, the cable as a whole being insulated by thermal insulation 4. An example of a superconductor such as 5 is described in patent document FR-A-2 674 671.

Figure 3:
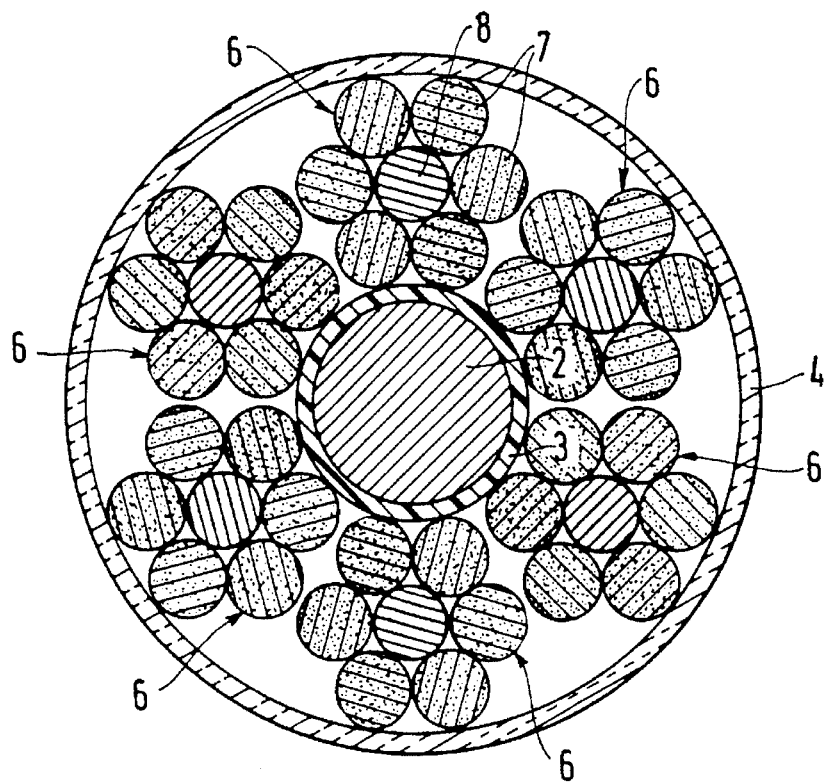

FIG. 3 shows yet another example of a cable suitable for making a superconducting switch of the invention.

As in FIG. 2, the cable is made up of six superconductors 6 twisted around a central resistive strand 2 that is not a superconductor, and separated therefrom by electrical insulation 3, the cable as a whole being insulated by thermal insulation 4.

In this figure, the various components of the superconductors 6, i.e. superconducting strands 7 and a central strand 8 are circular in section.

FIG. 4 shows a superconducting switch of the invention.

Such a switch comprises a length of cable 30 of the type described above with reference to FIGS. 1, 2, or 3.

At each end 31, 32 of the cable 1, the superconducting strands 1 (for a cable as shown in FIG. 1), or the superconductors 5 or 6 (for a cable as shown in FIGS. 2 or 3) are connected in parallel to the resistive central strand 2.

This connection may be performed, for example, by welds 10, 11.

In addition, at some point along the length of cable 30, the resistive central strand 2 is separated from the superconducting strands 1, or the superconductors 5 or 6, and passes outside the cable 30 and then, after passing through the refrigerating medium at 4.2 K. in which the cable is immersed, it is coupled to a control device 12 situated in the ambient medium at about 300 K. The function of this control device is to inject electrical current into the circuit formed by the resistive central strand 2 in parallel with the superconducting strands 1 (or the superconductors 5 or 6).

This current passing through the resistive central strand 2 causes it to be heated by the Joule effect over the entire length of the portion of cable 30. The heat given off in this way then diffuses into the superconducting strands 1 (or the superconductors 5 or 6), thereby causing them to switch to the normal state once the critical temperature is reached at 10 K. to 11 K.

FIG. 5 is an electrical circuit diagram showing the switch of FIG. 4 inserted in a current line 13 and also showing the control device 12.

The switch is represented by a circuit comprising the superconducting strands 1 (or the superconductors 5, 6) all represented by a single line, in parallel with the resistive central strand 2 which is represented by a line including a resistor R.

The resistive strand 2 is cut and its ends 14 and 15 are connected to the control device 12 situated at ambient temperature, i.e. 300 K. The device comprises a capacitor 16 connected in series with a discharge switch 17. A voltage source 18 is connected across the terminals of the capacitor 16, in series with a charging resistor 19 and a charging switch 20.

Operation is as follows. In the first stage of operation, the capacitor 16 is charged by closing the switch 20, while the switch 17 is open. The capacitor then charges through the resistor 19 up to the charging voltage of the source 18, thereby storing energy. The switch 20 is then opened and the circuit is in a waiting state. On receiving an "open superconducting switch" instruction, the switch 17 is closed, and the capacitor 16 then discharges into the circuit formed by the resistive central strand 2 and the superconducting strands 1 (or the superconductors 5 or 6). The flow of current in the resistive strand 2 of resistance R gives off heat by the Joule effect, which heat diffuses into the superconducting strands 1 (or 5 or 6) causing them to switch over to the non-superconducting, normal state.

The switches 17 and 20 may naturally be controlled switches using thyristors or transistors, thereby enabling the device to operate at the desired frequency.

Once the discharge current from the capacitor 17 has ceased, the strands 1 (or 5 or 6) return to the superconducting state on their own merely by being cooled by the refrigerating medium at 4.2 K. in which the circuit is immersed.

FIG. 6 shows another control device 12 which, by appropriate control 21 of the primary winding of a transformer 22, generates a voltage pulse across the terminals of the secondary winding of said transformer 22 which are connected to the ends 14 and 15.

Figure 7:
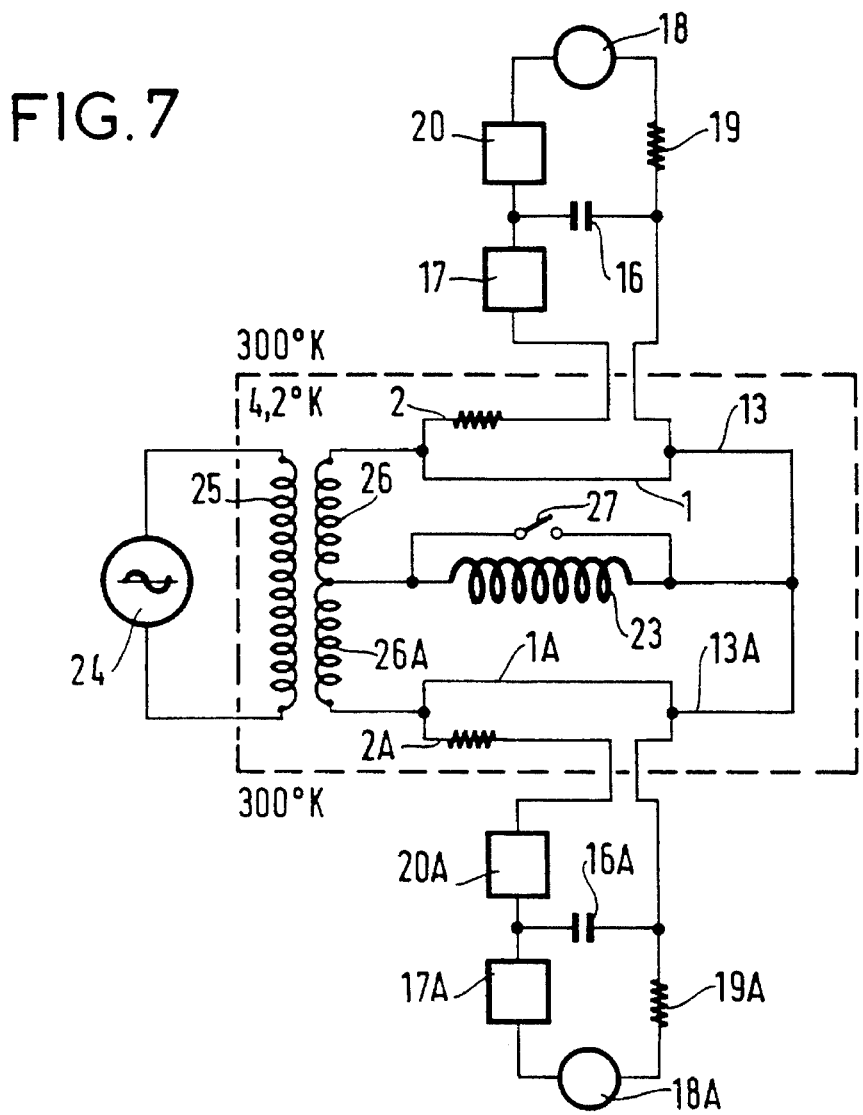
FIG. 7 is an electrical circuit diagram showing a charger for a coil together with superconducting switches controlled as shown in FIG. 5.

Finally, FIG. 7 shows an application of the switch device to a charger for a superconducting coil 23.

Directly charging a superconducting coil with high current gives rise to cryogenic losses that can become very large when high currents pass through the current feeds. The function of the current feeds is to convey current from a source at ambient temperature of about 300 K. to the superconducting coil which is at liquid helium temperature of 4.2 K.

The use of a charger for the coil makes it possible to reduce these losses considerably.

The coil charger comprises an AC voltage source 24 situated at ambient temperature of about 300 K. and connected to a full-wave rectifier circuit including a transformer whose primary winding 25 has a large number of turns $N_1$ and whose secondary winding comprises two portions 26 and 26A each having a number of turns $N_2$ that is much smaller than the number of turns in the primary winding. Each secondary winding 26 and 26A is connected in parallel with the coil 23 via respective control means constituted by a superconducting switch and its control device as shown in FIG. 5, serving to cause the superconducting strands 1 (or the superconductors 5 or 6) to switch from the superconducting state to the normal state on every other half-cycle. In the figure, index A is added to the references for the control means situated on the same side as secondary winding 26A.

Naturally, during every other half-cycle it is the winding 26 that feeds the coil 23 with the corresponding superconducting switch being closed while the other switch with reference indices A is open, then during the next half-cycle it is the winding 26A which feeds the coil 23, with the corresponding superconducting switch being closed while the other switch, without indices is open.

The switches 17, 20, 17A, and 20A are electronically controlled switches, e.g. thyristors.

Since the turns ratio $N_1/N_2$ is high, the current in the primary winding 25 is much less than the current in the secondary windings 26 and 26A, which current is equal to the charging current for the coil 23.

As a result, the current feeds coming from the outside and penetrating into the cryogenic medium at 4.2 K. carry a current that is much less than the charge current, so the losses that arise in the feeds are greatly reduced.

On each half-cycle, the coil is fed either by the winding 26 or else by the winding 26A, and the current in the coil is increased by a certain amount. On each half-cycle, a certain quantity of energy is transferred from the primary circuit into the coil 23.

Once the coil has been charged, a superconducting switch 27 is closed to short-circuit the two ends of the coil so that it then stores a certain quantity of energy.

The superconducting switch of the present invention is capable of operating at 50 Hz and is therefore particularly advantageous in an application to charging a coil.

To make this possible, a switch such as that shown in FIG. 5 together with its control device must have an opening time (time taken by the superconducting strands 1 or the superconductors 5 or 6 to switch from the superconducting state to the normal state) of about 1 ms, and a closure time (recovery of the superconducting state) of 2 ms to 3 ms.

The following tables gives a few examples of cables of the type described in FIG. 1 in which the central strand is insulated by enamelling, and that enable the above characteristics to be obtained:

| Diameter of a superconducting strand 1 | Diameter of the central strand 2 | Thickness of the insulation 3 on the central strand 2 | Thickness of the insulation 4 |
|---|---|---|---|
| 0.3 mm | 0.25 mm | 0.025 mm | 0.05 mm |
| 0.2 mm | 0.15 mm | 0.025 mm | 0.1 mm |
| 0.2 mm | 0.15 mm | 0.025 mm | 0.05 mm |

We claim:

1. A superconducting switch comprising a portion of cable including a resistive central strand that is non-superconducting having twisted thereabout a plurality of one of superconducting strands or superconductors, and separated from the central strand by electrical insulation, the cable as a whole being insulated from an external cooling medium by thermal insulation, said central strand being electrically connected to said plurality of one of superconducting strands or superconductors at each end of said portion of cable, wherein a portion of the length of said resistive central strand extends outside said cable at a point along the length of said portion of said cable and is coupled to a control device disposed outside said cooling medium, said control device injecting an electrical current into the circuit formed by the resistive central strand that is connected at its ends to said plurality of one of superconducting strands or superconductors.

2. A superconducting switch according to claim 1, wherein said portion of the length of said resistive central strand outside said cable is cut, thereby forming two ends which are connected to said control device that comprises a capacitor in series with a discharge switch, a voltage source being connected across the terminals of said capacitor via a charging resistor and a charging switch.

3. A superconducting switch according to claim 2, wherein said charging switch and said discharge switch are controlled electronic switches.

4. A superconducting switch according to claim 1, wherein said portion of the length of said extracted resistive central strand is cut, thereby forming two ends which are connected to said control device which, by controlling a primary winding of a transformer, generates a voltage pulse across terminals of a secondary winding of said transformer which are connected to said ends.

5. A charger for a superconducting coil, the charger comprising an AC voltage source in a medium at ambient temperature and connected to a full-wave rectifier circuit feeding the superconducting coil, the rectifier and the coil being situated in a refrigerating medium, the rectifier circuit comprising a transformer having a primary winding and a secondary winding in two portions, each portion being connected in parallel with the coil and feeding the coil alternately via a controller that operates every other half-cycle to cause the connection between the corresponding portion of said secondary winding and the coil to switch from the superconducting state to the normal state, wherein each said controller comprises a superconducting switch comprising:

a portion of cable including a resistive central strand that is non-superconducting having twisted thereabout a plurality of one of superconducting strands or superconductors, and separated from the central strand by electrical insulation, the cable as a whole being insulated from an external cooling medium by thermal insulation, said central strand being electrically connected to said plurality of one of superconducting strands or superconductors at each end of said portion of cable, wherein a portion of the length of said resistive central strand extends outside said cable at a point along the length of said portion of said cable and is coupled to a control device disposed outside said cooling medium, said control device injecting an electrical current into the circuit formed by the resistive central strand that is connected at its ends to said plurality of one of superconducting strands or superconductors.

* * * * *